United States Patent
Oishi et al.

(10) Patent No.: US 7,667,523 B2
(45) Date of Patent: Feb. 23, 2010

(54) ORTHOGONAL SIGNAL OUTPUT CIRCUIT

(75) Inventors: Kazuaki Oishi, Kawasaki (JP);
Nobuhiko Kobayashi, Tokyo (JP);
Masahiro Kudo, Tokyo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/404,446

(22) Filed: Mar. 16, 2009

(65) Prior Publication Data
US 2009/0302925 A1    Dec. 10, 2009

(30) Foreign Application Priority Data
Jun. 5, 2008    (JP) .............................. 2008-147921

(51) Int. Cl.
*G06F 7/12*    (2006.01)

(52) U.S. Cl. ...................... 327/359; 327/355; 327/361; 455/326

(58) Field of Classification Search ......... 327/355–361; 455/326, 333
See application file for complete search history.

(56) References Cited
U.S. PATENT DOCUMENTS

| | | | |
|---|---|---|---|
| 5,355,101 A * | 10/1994 | Ichihara et al. ............ | 332/103 |
| 6,516,186 B1 | 2/2003 | Yamagishi et al. | |
| 7,050,779 B2 * | 5/2006 | Ono et al. .................... | 455/333 |
| 7,113,760 B1 * | 9/2006 | Petrov et al. ................ | 455/324 |
| 7,139,546 B1 * | 11/2006 | Petrov et al. ................ | 455/323 |
| 7,457,606 B2 * | 11/2008 | Kim ........................... | 455/323 |

FOREIGN PATENT DOCUMENTS

| | | |
|---|---|---|
| JP | 2000-115265 | 4/2000 |
| JP | 2002-232497 | 8/2002 |

* cited by examiner

*Primary Examiner*—Dinh T. Le
(74) *Attorney, Agent, or Firm*—Katten Muchin Rosenman LLP

(57) ABSTRACT

An orthogonal signal output circuit having an error correction function for correcting an orthogonal error, including: first and second differential circuits; and first to fourth variable resistors, wherein the first variable resistor is connected to a positive output of the first differential circuit and a positive output of the second differential circuit; the second variable resistor is connected to the positive output of the first differential circuit and a negative output of the second differential circuit; the third variable resistor is connected to a negative output of the first differential circuit and the positive output of the second differential circuit; and the fourth variable resistor is connected to the negative output of the first differential circuit and the negative output of the second differential circuit.

7 Claims, 10 Drawing Sheets

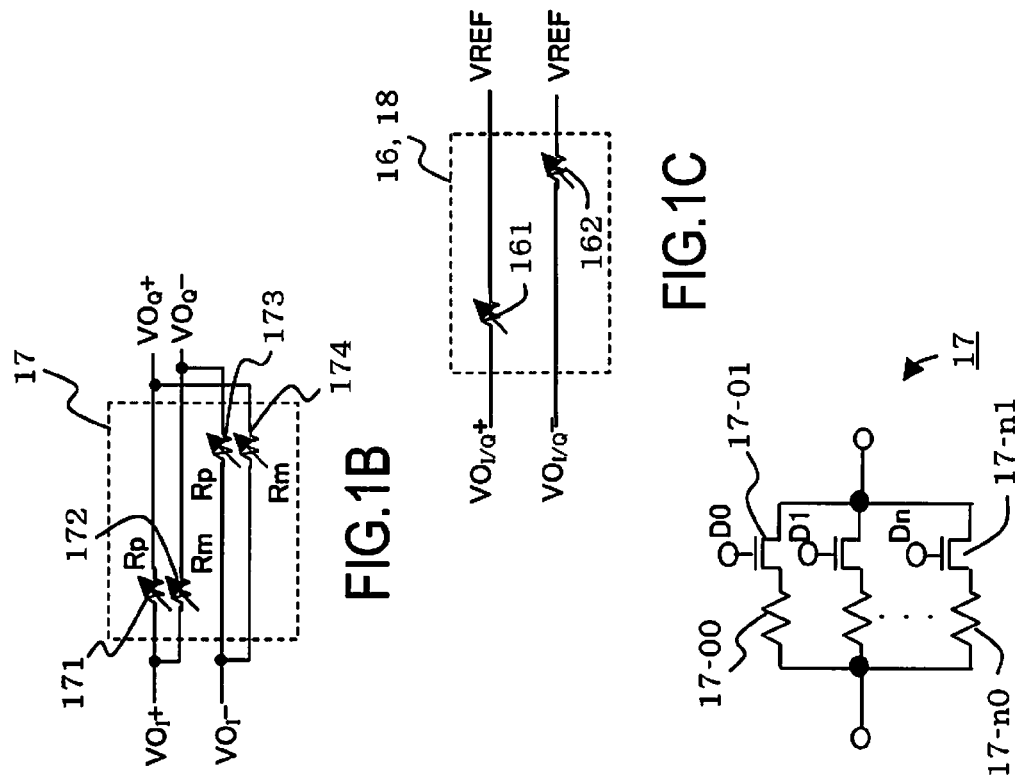
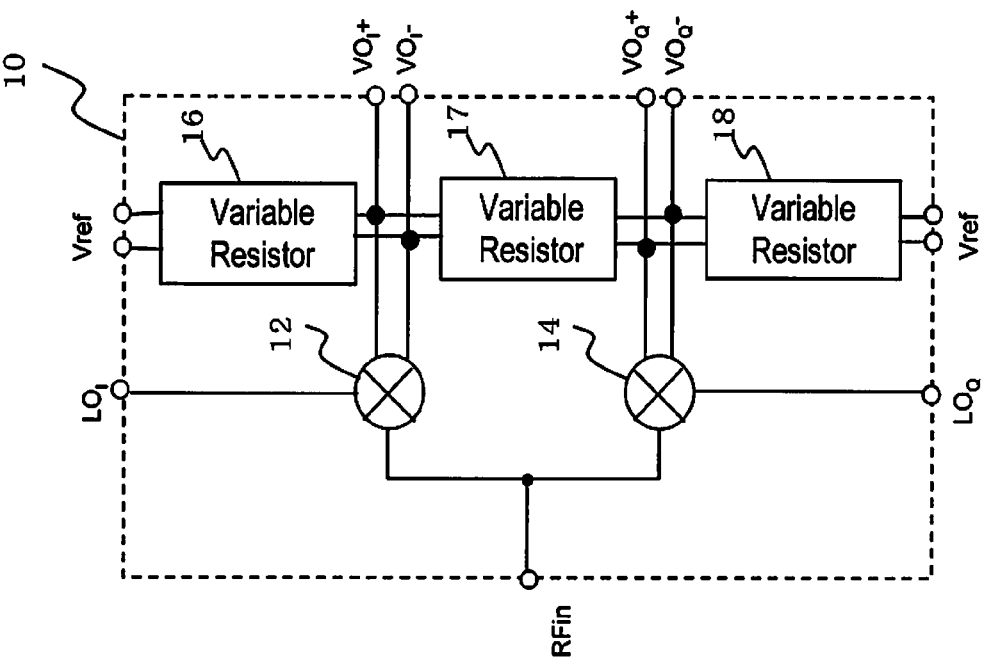

ORTHOGONAL SIGNAL OUTPUT CIRCUIT

CROSS-REFERENCE TO RELATED APPLICATION

This application is based upon and claims the benefit of priority of the prior Japanese Patent Application No. 2008-147921, filed on Jun. 5, 2008, the entire contents of which are incorporated herein by reference.

FIELD

The embodiment(s) discussed herein is (are) related to an orthogonal signal output circuit.

BACKGROUND

An orthogonal down mixer (orthogonal demodulator) is typically used in a reception device of a cellular telephone or the like. The orthogonal down mixer has two mixer circuits. A local signal is applied to each mixer circuit, and the two mixer circuits respectively convert high frequency reception signals into low frequency signals (an I signal and a Q signal) and output the low frequency signals.

Further, an image elimination type reception device (employing a heterodyne system) outputs two low frequency signals following conversion into intermediate frequency signals by the orthogonal down mixer.

In this type of orthogonal down mixer or the like, the phases of the two output signals preferably deviates by 90°, and for this purpose, the phases of the two local signals applied to the mixer circuits of the orthogonal down mixer preferably also deviates by precisely 90°.

However, the frequency of the local signals applied to the respective mixer circuits is high, and it is therefore difficult to cause the phase to deviate by precisely 90°.

Hence, an image elimination type receiver and an orthogonal modulator formed to be capable of correcting a phase error are known in the prior art (Japanese Patent No. 3,398,910 and Japanese Laid-open Patent Publication No. 2002-232497, for example).

However, in the image elimination type receiver discussed in Japanese Patent No. 3,398,910, the high frequency local signal applied to one of the mixers is adjusted, and therefore the precision with the phase difference between the local signals is shifted to 90° is poor. Further, a circuit for adjusting the phase handles the high frequency local signals, and therefore the overall power consumption of the receiver is large. Moreover, a control circuit and a plurality of phase adjustment circuits are provided, and therefore the circuit area of the receiver is large.

Further, in the orthogonal modulator discussed in Japanese Laid-open Patent Publication No. 2002-232497, analog calculation processing is performed on the two low frequency signals (the I signal and the Q signal), and therefore an active element is employed, leading to increases in the overall circuit area and power consumption of the orthogonal modulator. Moreover, it is difficult to execute analog calculations at a high frequency, and therefore, although this technique can be applied in principle to an orthogonal modulator in which the orthogonal signals have a low frequency, it cannot be used in a receiver in which the orthogonal signals have a high frequency.

SUMMARY

According to an aspect of the invention, an orthogonal signal output circuit having an error correction function for correcting an orthogonal error, including: first and second differential circuits; and first to fourth variable resistors, wherein the first variable resistor is connected to a positive output of the first differential circuit and a positive output of the second differential circuit; the second variable resistor is connected to the positive output of the first differential circuit and a negative output of the second differential circuit; the third variable resistor is connected to a negative output of the first differential circuit and the positive output of the second differential circuit; and the fourth variable resistor is connected to the negative output of the first differential circuit and the negative output of the second differential circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1A depicts a constitutional example of an orthogonal down mixer, and FIGS. 1B to 1D depict respectively constitutional examples of variable resistors;

DESCRIPTION OF EMBODIMENTS

Figure 2:
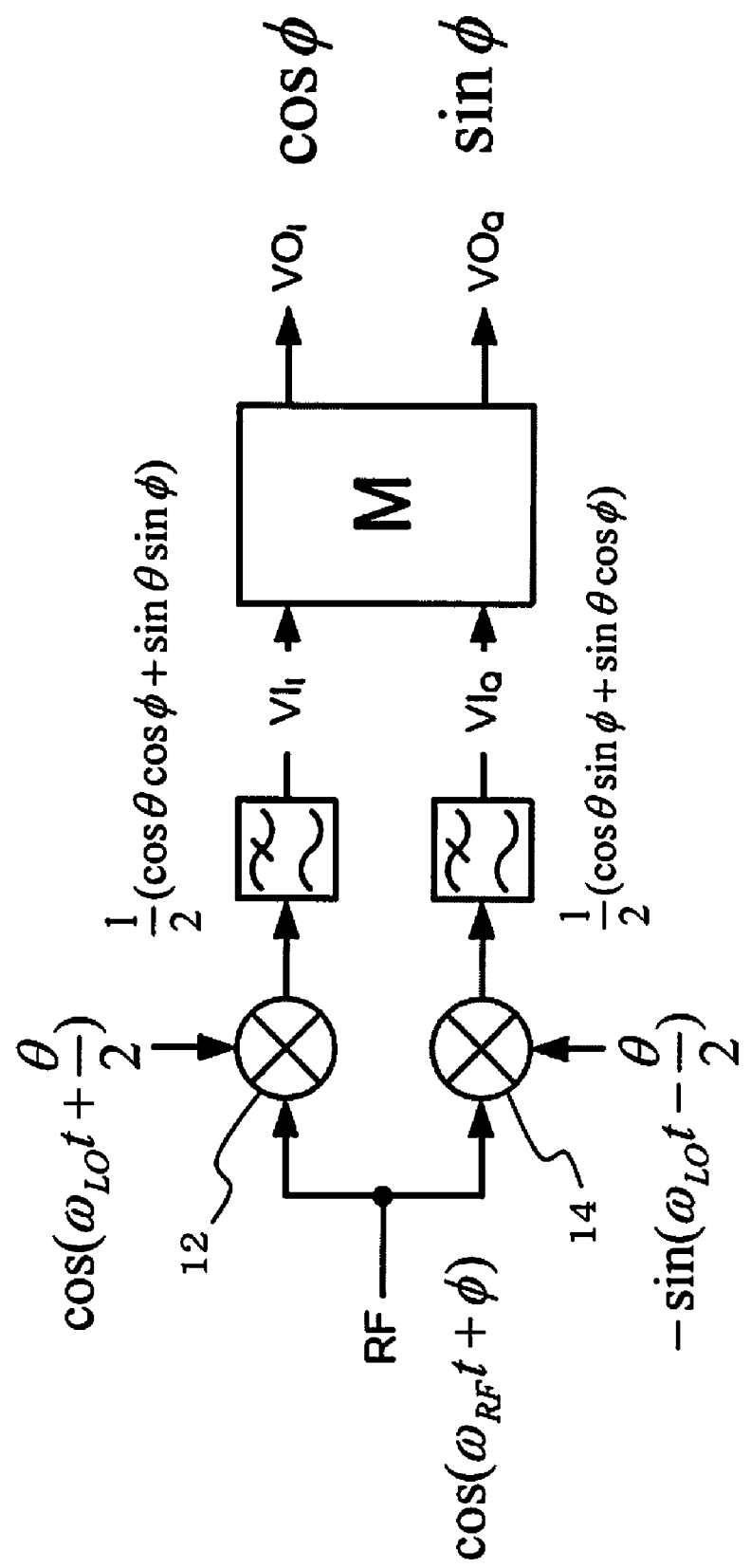
FIG. 2 depicts another constitutional example of an orthogonal down mixer.

Embodiments of the present invention will be described below with reference to the drawings.

First Embodiment

First, a first embodiment will be described. FIG. 1A depicts an orthogonal down mixer (orthogonal demodulator) 10, and FIGS. 1B to 1D depict constitutional examples of variable resistors 16 to 18.

As depicted in FIG. 1A, the orthogonal down mixer 10 includes two mixer circuits 12, 14 and three variable resistors 16 to 18.

The mixer circuits 12, 14 respectively input a high frequency reception signal (RF signals) and output low frequency output signals (I signals (VOI+, VOI−) and Q signals (VOQ+, VOQ−)) using local signals (LOI, LOQ) input respectively therein.

The variable resistor 16 is connected to a reference voltage (Vref, alternatively a power supply or an earth) at one end and the outputs (VOI+, VOI−) of the mixer circuit 12 at the other end. In other words, the variable resistor 16 is connected between the positive output (VOI+) and negative output (VOI−) of the mixer circuit 12 and the reference voltage (Vref). The variable resistor 16 is used to adjust gain in the outputs (VOI+, VOI−) output from the mixer circuit 12.

The variable resistor 17 is connected to the outputs (VOI+, VOI−) of the mixer circuit 12 at one end and the outputs (VOQ+, VOQ−) of the mixer circuit 14 at the other end. In other words, the variable resistor 17 is connected between the positive and negative outputs (VOI+, VOI−) of the mixer circuit 12 and the positive and negative outputs (VOQ+, VOQ−) of the mixer circuit 14. The variable resistor 17 is used to adjust a phase difference between the output signals (VOI, VOQ) output respectively by the two mixer circuits 12, 14.

The variable resistor 18 is connected to the reference voltage (Vref) at one end and the output (VOQ) of the mixer circuit 14 at the other end. In other words, the variable resistor 18 is connected between the reference voltage and the positive and negative outputs (VOQ+, VOI−) of the mixer circuit 14. The variable resistor 18 is used to adjust gain in the outputs (VOQ+, VOQ−) output from the mixer circuit 14.

Figure 10B:
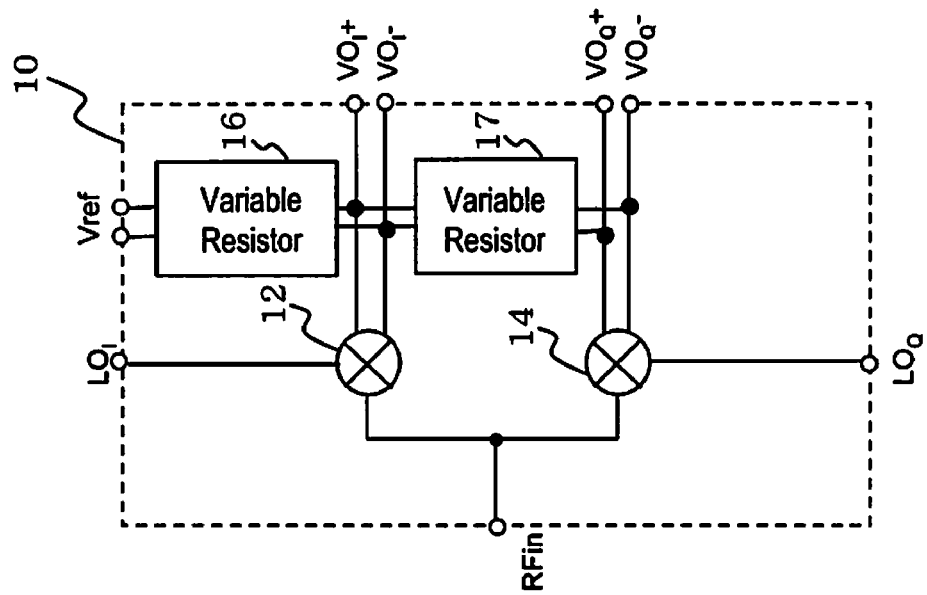
FIGS. 10A and 10B depict another constitutional examples of an orthogonal down mixer.
Figure 10A:
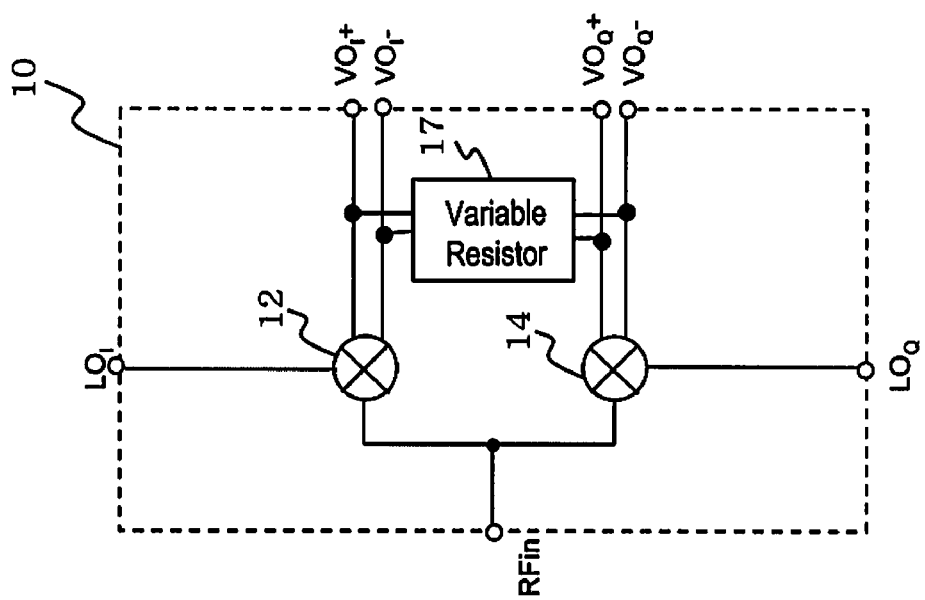

Here, if there is no gain error between the two mixer circuits 12, 14, the two variable resistors 16, 18 may be eliminated (FIG. 10A).

If the magnitude relationship between the gains of the two mixer circuits 12, 14 is known in advance, one of the two variable resistors 16, 18 may be eliminated (FIG. 10B).

Next, adjustment of the phase difference between the output signals (VOI, VOQ) to 90°, which is performed by the orthogonal down mixer 10 when the phase difference between the local signals (LOI, LOQ) deviates from 90° (when a phase error occurs), will be described.

FIG. 2 depicts another constitutional example of the orthogonal down mixer 10. A case in which $$\cos(\omega_{RF}t+\phi) \quad \text{[Expression 1]}$$

is input into the two mixer circuits 12, 14 as an input RF signal and $$\cos\left(\omega_{LO}t + \frac{\theta}{2}\right) \quad \text{[Expression 2]}$$

and $$-\sin\left(\omega_{LO}t - \frac{\theta}{2}\right) \quad \text{[Expression 3]}$$

are respectively input into the two mixer circuits 12, 14 as the local signals (LOI, LOQ) will be considered. Here, $\phi$ denotes a phase relating to a modulated data signal, and $\theta$ denotes a phase error between the two local signals.

At this time, the respective outputs of the two mixer circuits 12, 14 are $$\frac{1}{2}(\cos\theta\cos\phi + \sin\theta\sin\phi) \quad \text{[Expression 4]}$$

and $$\frac{1}{2}(\cos\theta\sin\phi + \sin\theta\cos\phi) \quad \text{[Expression 5]}$$

As depicted in Expressions 4 and 5, the two outputs are affected by the phase error $\theta$ between the local signals (LOI, LOQ).

Here, a matrix M is set as depicted by the following equation, and when the two outputs are passed through the matrix M, ideal output signals (VOI, VOQ) are output. These output signals are respectively expressed by $\cos\phi$ and $\sin\phi$, whereby the effect of the phase difference $\theta$ is eliminated.

$$\begin{aligned} M &= \left(\frac{2}{\cos\theta - \sin\theta\tan\theta}\right) \cdot \begin{bmatrix} 1 & -\tan\theta \\ -\tan\theta & 1 \end{bmatrix} \\ &= \left(\frac{2}{\cos^2\theta - \sin^2\theta}\right) \cdot \begin{bmatrix} \cos\theta & -\sin\theta \\ -\sin\theta & \cos\theta \end{bmatrix} \end{aligned} \quad \text{[Expression 6]}$$

The matrix M depicted in Expression 6 is inserted into a latter stage of the two mixer circuits 12, 14. Thus, the phase error $\theta$ between the local signals (LOI, LOQ) can be mathematically eliminated such that two output signals (VOI, VOQ) deviating by precisely 90° are obtained. In other words, a circuit having the shape of the matrix M should be inserted into the latter stage of the mixer circuits 12, 14.

Figure 3B:
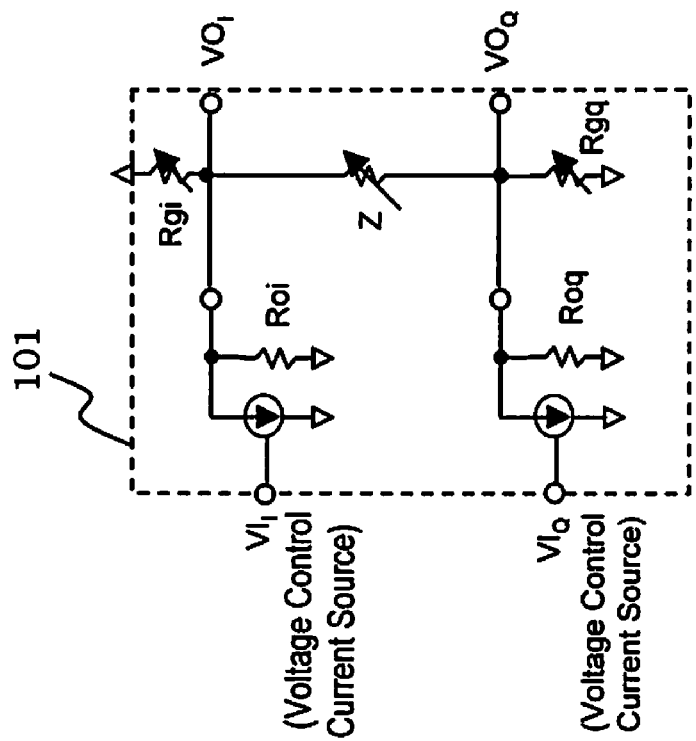
FIG. 3B depicts a constitutional example of an equalizing circuit thereof.
Figure 3A:
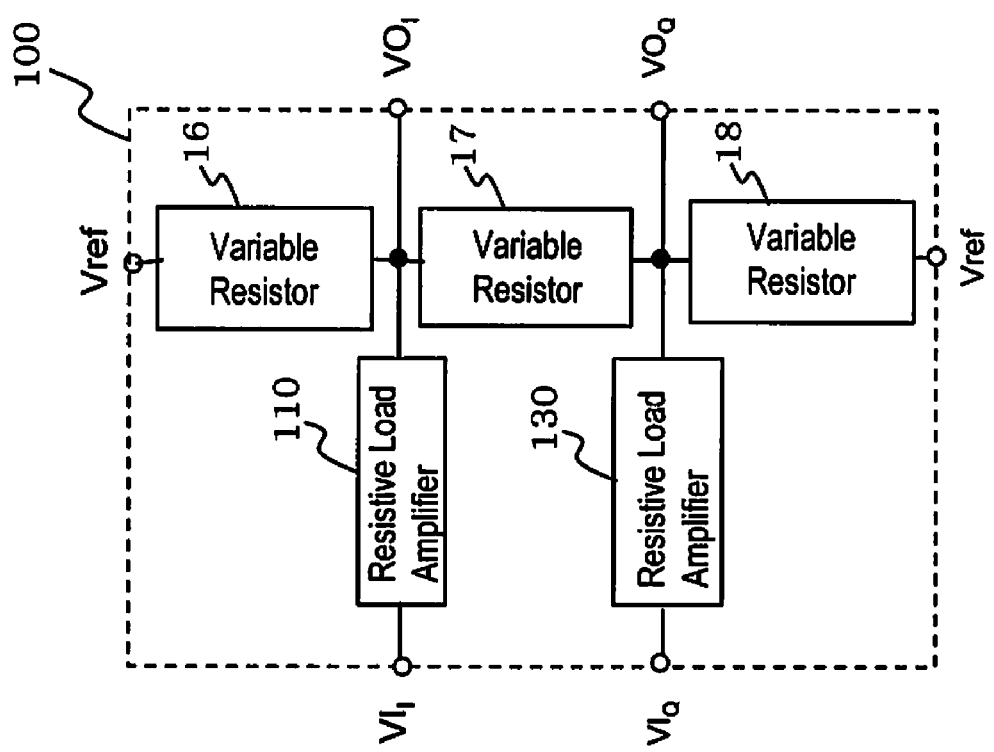
FIG. 3A depicts a constitutional example of an error correction circuit.

FIG. 3A depicts a constitutional example of an orthogonal error correction circuit (a phase and gain adjustment circuit or an orthogonal error correction device) 100 into which this circuit is inserted, and FIG. 3B depicts a constitutional example of an equalizing circuit 101 thereof.

The orthogonal error correction circuit 100 includes resistive load amplifiers 110, 130 and the three variable resistors 16 to 18.

The resistive load amplifiers 110, 130 respectively input input signals (VII, VIQ) and output output signals (VOI, VOQ).

The variable resistor 16 is connected to the reference voltage (Vref) at one end and to the output (VOI) of the resistive load amplifier 110 at the other end.

The variable resistor 17 is connected between the outputs (VOI, VOQ) of the two resistive load amplifiers 110, 130.

The variable resistor 18 is connected to the output (VOQ) of the resistive load amplifier 130 at one end and to the reference voltage (Vref) at the other end.

In the equalizing circuit 101 depicted in FIG. 3B, the variable resistors 16, 17, 18 correspond respectively to resistances Rgi, Z, Rgq. At this time, a transfer function from the inputs (VII, VIQ) to the outputs (VOI, VOQ) is expressed as $$\begin{bmatrix} VO_I \\ VO_Q \end{bmatrix} = \frac{A}{\alpha^2 - \beta^2} \cdot \begin{bmatrix} \alpha & -\beta \\ -\beta & \alpha \end{bmatrix} \cdot \begin{bmatrix} VI_I \\ VI_Q \end{bmatrix} \quad \text{[Expression 7]}$$

Here, A in Expression 7 is a constant, and the other variables and constants are as depicted below.

$$R_O = Rol\|Rgi = Roq\|Rgq \quad \text{[Expression 8]}$$
$$\alpha = \frac{1}{R_O} + \frac{1}{Z}$$
$$\beta = -\frac{1}{Z}$$

It becomes Expression 7 and Expression 8 if it thinks about the phase error for simplification. The equation depicted in Expression 7 takes an identical shape to Expression 6, which illustrates the matrix M for obtaining an ideal output. Hence, with the orthogonal error correction circuit 100 depicted in FIG. 3A, output signals (VOI, VOQ) with no phase error can be obtained by adjusting the resistance of the variable resistor 17.

Figure 4B:
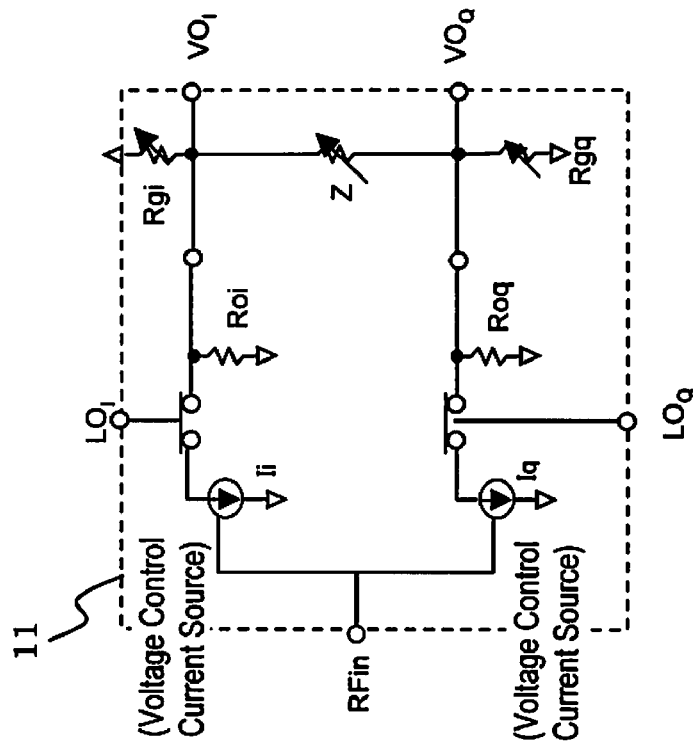
FIG. 4B depicts a constitutional example of an equalizing circuit thereof.
Figure 4A:
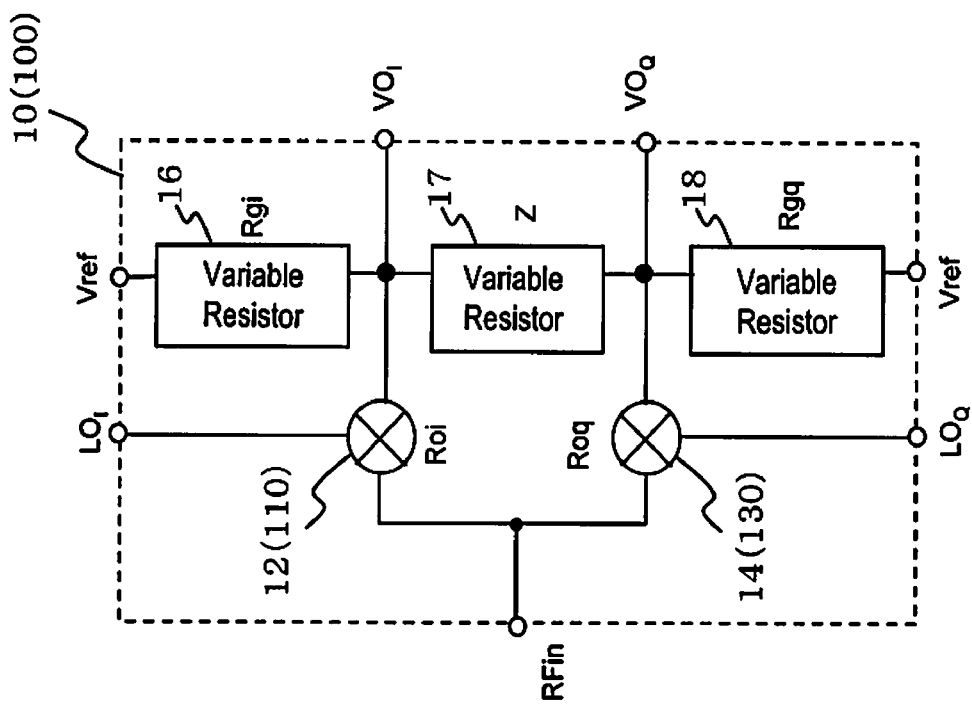
FIG. 4A depicts a constitutional example of an orthogonal down mixer.

FIG. 4A depicts a constitutional example of the orthogonal down mixer 10 including the orthogonal error correction circuit 100. The orthogonal down mixer 10 is identical to the orthogonal down mixer 10 depicted in FIG. 1A. Further, the orthogonal down mixer 10 depicted in FIG. 4A is an example in which the resistive load amplifiers 110, 130 of the orthogonal error correction circuit 100 of FIG. 3 are used as the mixer circuits 12, 14.

FIG. 4B depicts an example of an equalizing circuit of the orthogonal down mixer 10 depicted in FIG. 4A. In an equalizing circuit 11 depicted in FIG. 4B, a transfer function from inputs (Ii, Iq) to the outputs (VOI, VOQ) is expressed as $$\begin{bmatrix} VO_I \\ VO_Q \end{bmatrix} = \frac{A}{\alpha^2 - \beta^2} \cdot \begin{bmatrix} \alpha & -\beta \\ -\beta & \alpha \end{bmatrix} \cdot \begin{bmatrix} I_I \\ I_Q \end{bmatrix} \quad \text{[Expression 9]}$$

Expression 9 also takes an identical shape to Expression 6, with which an ideal output is obtained. Hence, the phase of the output signals (VOI, VOQ) can be adjusted by varying the resistance Z of the variable resistor 17, and as a result, output signals (VOI, VOQ) with no phase error can be obtained. In other words, by adjusting the resistance Z of the variable resistor 17 in the orthogonal down mixer 10 depicted in FIG. 1A, the phase error θ of the output signals (VOI+ to VOQ−) can be eliminated. The variable resistor 17 will be described in detail below.

FIG. 1B depicts a constitutional example of the variable resistor 17. The variable resistor 17 includes four variable resistances 171 to 174.

The variable resistance 171 is connected between the positive output (VOI+) of the mixer circuit 12 and the positive output (VOQ+) of the mixer circuit 14.

The variable resistance 172 is connected between the positive output (VOI+) of the mixer circuit 12 and the negative output (VOQ−) of the mixer circuit 14.

The variable resistance 173 is connected between the negative output (VOI−) of the mixer circuit 12 and the negative output (VOQ−) of the mixer circuit 14.

The variable resistance 174 is connected between the negative output (VOI−) of the mixer circuit 12 and the positive output (VOQ+) of the mixer circuit 14.

When the resistance values of the four variable resistances 171 to 174 are set at Rp, Rm, as depicted in FIG. 1B, an impedance Z of the variable resistor 17 is as follows.

$$Z = \frac{Rp \cdot Rm}{Rm - Rp} \quad \text{[Expression 10]}$$

The impedance Z takes a positive value when Rp<Rm and a negative value when Rp>Rm, and therefore Expression 10 is positive-negative adjustable. More specifically, the overall resistance Z of the variable resistor 17 can be adjusted such that the value of the phase error θ between the output signals (VOI, VOQ) reaches "0" regardless of whether the phase error θ is positive or negative.

FIG. 1C depicts a constitutional example of the variable resistors 16, 18. Two variable resistances 161, 162 are provided in each of the variable resistors 16, 18, and the connection relationships thereof are as described above.

FIG. 1D depicts another constitutional example of the variable resistances (171, 172, 173, 174, 161, 162). The variable resistor 17 may include a plurality of resistances 17-00 to 17-$n$0 and a plurality of transistors 17-01 to 17-$n$1.

Figure 5:
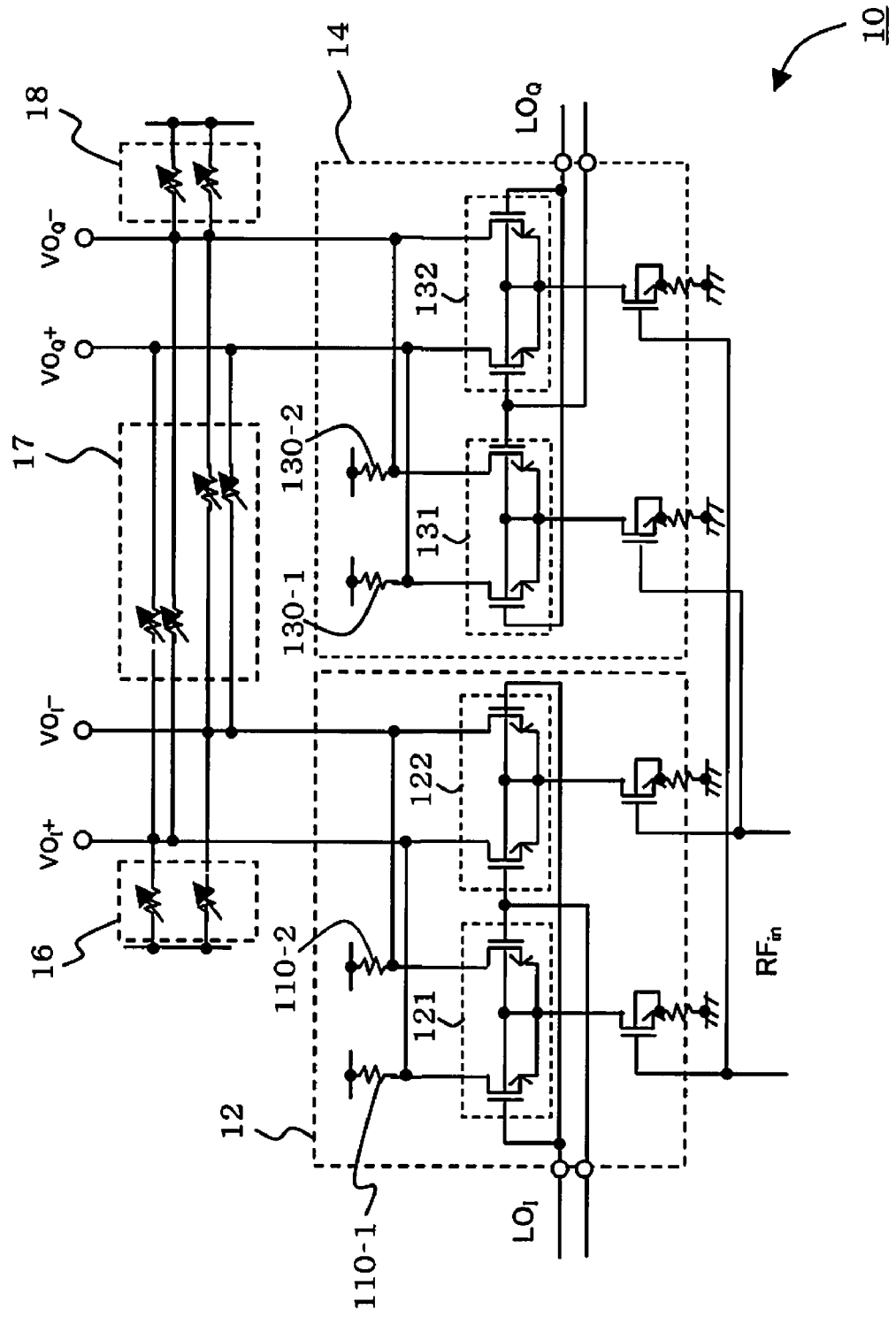
FIG. 5 depicts a constitutional example of circuits of the orthogonal down mixer.

FIG. 5 depicts a constitutional example of the circuits of the orthogonal down mixer 10. The mixer circuits 12, 14 respectively include two differential pairs 121 to 122 and 131 to 132. Differential pair 121 and 122 is connected to resistances 110-1 and 110-2, respectively. Differential pair 131 and 132 is connected to resistances 130-1 and 130-2, respectively. And the outputs (VOI+ to VOQ−) are obtained from the differential pair 121, 122, 131, and 132. Note that the mixer circuits 12, 14 are resistive load double balance mixers. The resistances 110-1 to 110-2, 130-1 to 130-2 are load resistance of mixer. And the variable resistor 17 can be used to adjust the phase of the output signals. The connection relationships between the variable resistors 16 to 18 of the orthogonal down mixer 10 depicted in FIG. 5 are identical to those of the orthogonal down mixer 10 depicted in FIG. 1A.

Next, results of a simulation in which the resistance values of the variable resistors 16 to 18 are varied in the orthogonal down mixer 10 will be described.

Figure 6A:
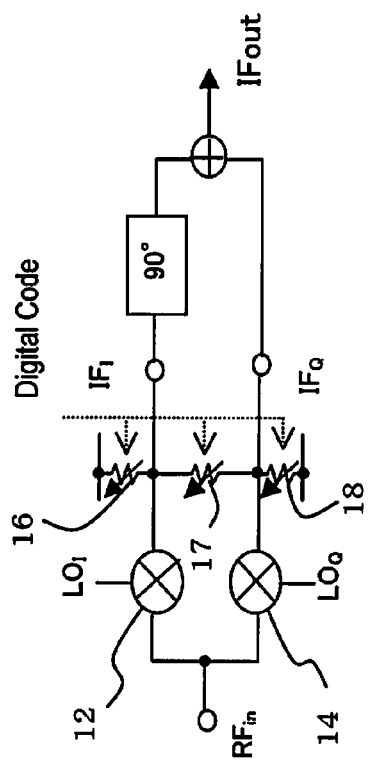
FIG. 6A depicts a constitutional example of an image elimination type reception device.

FIG. 6A depicts a constitutional example of circuits of a simulation subject (an example of an image elimination reception device including the orthogonal down mixer 10 depicted in FIG. 1 and so on), and FIGS. 1B and 1C depict examples of simulation results.

In this simulation, as depicted in FIG. 6A, a digital code is input into the respective variable resistors 16 to 18 to make the resistance values thereof variable.

Figure 6C:
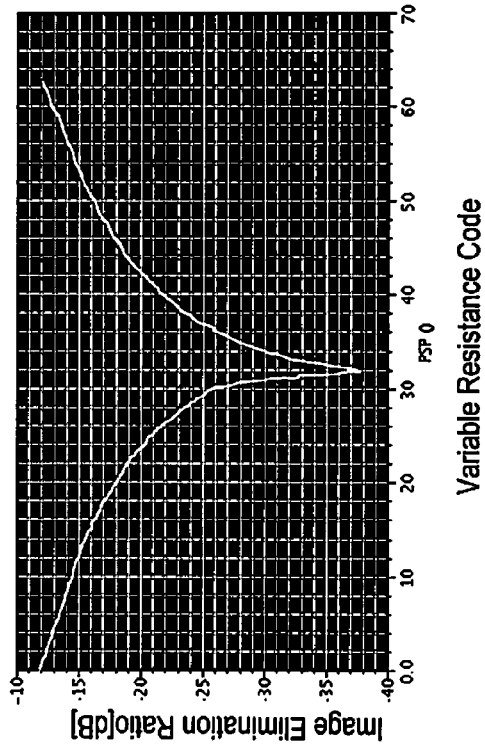
FIGS. 6B and 6C depict examples of simulation results.
Figure 6B:
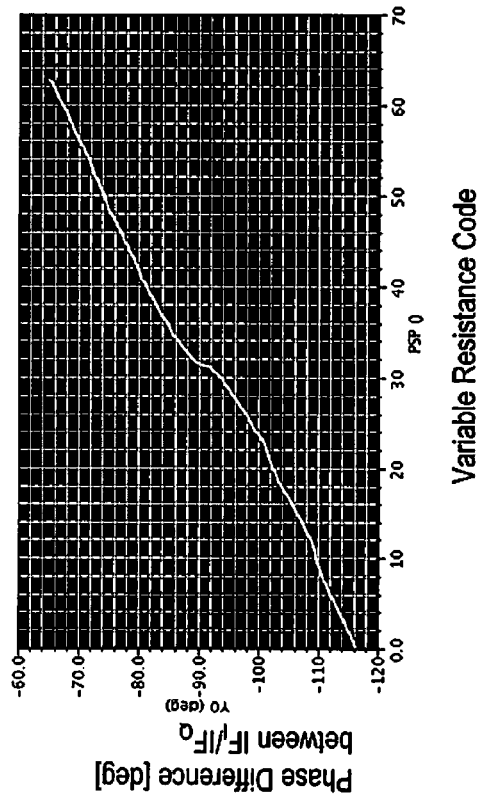

FIG. 6B depicts a graph of variation in a phase difference between intermediate frequency signals (IF1, IF2) relative to the digital code (variable resistance code) input into the variable resistors 16 to 18. As is clear from FIG. 6B, by varying the resistance values of the variable resistors 17, the phase difference can be adjusted precisely from −120 degrees to −90 degrees (ideal value) to −60 degrees.

FIG. 6C depict a graph of a relationship between the variable resistance code and an image elimination ratio (an unnecessary frequency component elimination ratio). It can be seen from the graph that the elimination ratio reaches a maximum with a resistance code at which the phase difference reaches −90 degrees.

The first embodiment is an example in which the orthogonal error correction circuit 100 (FIG. 3) is applied to the orthogonal down mixer 10 (FIG. 1 and so on) More specifically, the first embodiment is an example in which the resistive load amplifiers 110, 130 of the orthogonal error correction circuit 100 are used as the mixer circuits 12, 14.

Thus, in the orthogonal down mixer 10, the variable resistors 16 to 18 are connected to the output side of the mixer circuits 12, 14, and therefore the phase error in the output signals caused by a phase error in the local signals is adjusted on the low frequency side of the mixer output 12, 14. Hence, in comparison with a case in which adjustment is performed using high frequency local signals, the phase error can be corrected with a high degree of precision.

Further, only the variable resistors 16 to 18 are added to the orthogonal down mixer 10, and therefore, in comparison with the prior art in which various active elements are added, the surface area and power consumption can be reduced. Moreover, the variable resistor 17 may includes a resistance and a transistor which operates as a switch, and therefore high-speed operations are possible.

Second Embodiment

Next, a second embodiment will be described. The second embodiment is an example in which the orthogonal error correction circuit 100 (FIG. 3A) is applied to an orthogonal up mixer (orthogonal modulator).

Figure 7:
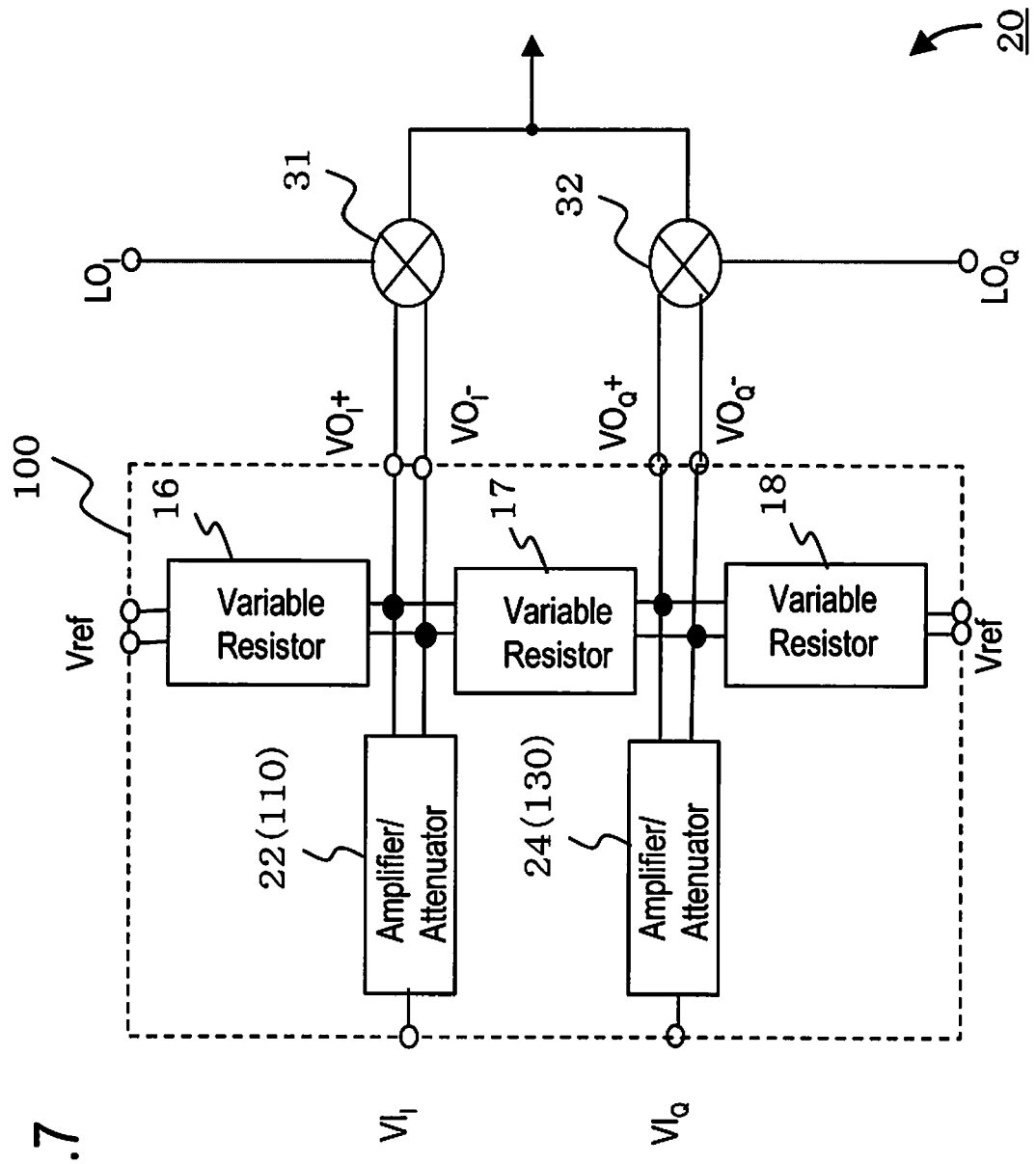
FIG. 7 depicts a constitutional example of an orthogonal up mixer.

FIG. 7 depicts a constitutional example of an orthogonal up mixer 20. The orthogonal up mixer 20 includes amplifier/attenuators 22, 24, the variable resistors 16 to 18, and mixer circuits 31, 32. The orthogonal error correction circuit 100 includes the amplifier/attenuators 22, 24 and the variable resistors 16 to 18. The second embodiment is an example in which the resistive load amplifiers 110, 130 of the orthogonal error correction circuit 100 are used as the amplifier/attenuators 22, 24.

The amplifier/attenuators 22, 24 amplify or attenuate signals (VII, VIQ) input respectively therein, and then output the signals.

The variable resistor 16 is used to adjust the gain of the output signals (VOI+, VOI−), and is connected between the reference voltage (Vref, alternatively the power supply or earth) and the outputs (VOI+, VOI−) of the amplifier/attenuator 22.

The variable resistor 17 is used to adjust the phase error between the output signals (VOI, VOQ), and is connected between the outputs (VOI+ to VOQ−) of the two amplifier/attenuators 22, 24. The variable resistor 17 is depicted in FIG. 1B. Specifically, the variable resistor 17 includes the four variable resistances 171 to 174.

The variable resistance 171 is connected between the positive output (VOI+) of the amplifier/attenuator 22 and the positive output (VOQ+) of the amplifier/attenuator 24.

The variable resistance 172 is connected between the positive output (VOI+) of the amplifier/attenuator 22 and the negative output (VOQ−) of the amplifier/attenuator 24.

The variable resistance 173 is connected between the negative output (VOI−) of the amplifier/attenuator 22 and the negative output (VOQ−) of the amplifier/attenuator 24.

The variable resistance 174 is connected between the negative output (VOI−) of the amplifier/attenuator 22 and the positive output (VOQ+) of the amplifier/attenuator 24. The impedance Z of the variable resistor 17 is as depicted in Expression 10.

The variable resistor 18 is used to adjust the gain of the output signals (VOQ+, VOQ−), and is connected between the outputs (VOQ+, VOQ−) of the amplifier/attenuator 24 and the reference voltage (Vref).

The two mixer circuits 31, 32 input the output signals (VOI+ to VOQ−) of the respective amplifier/attenuators 22, 24, convert the input signals into high frequency signals using the respective local signals (LOI, LOQ), and then output the high frequency signals.

Hence, in the orthogonal up mixer 20, the phase error θ of the output signals (VOI+, VOI−, VOQ+, VOQ−) is adjusted by the orthogonal error correction device 100 on the input side of the mixer circuits 31, 32, or in other words on the low frequency side, and therefore precision is improved in comparison with a case in which adjustment is performed on the high frequency side. Further, similarly to the first embodiment, only the variable resistors 16 to 18 are added, and therefore surface area and power consumption are reduced in comparison with the prior art. Moreover, the variable resistor 17 includes a resistance and a transistor, similarly to the first embodiment, thereby enabling high-speed processing.

Third Embodiment

Next, a third embodiment will be described. The third embodiment is an example in which the orthogonal error correction circuit 100 is applied to an image elimination type reception device 200.

Figure 8:
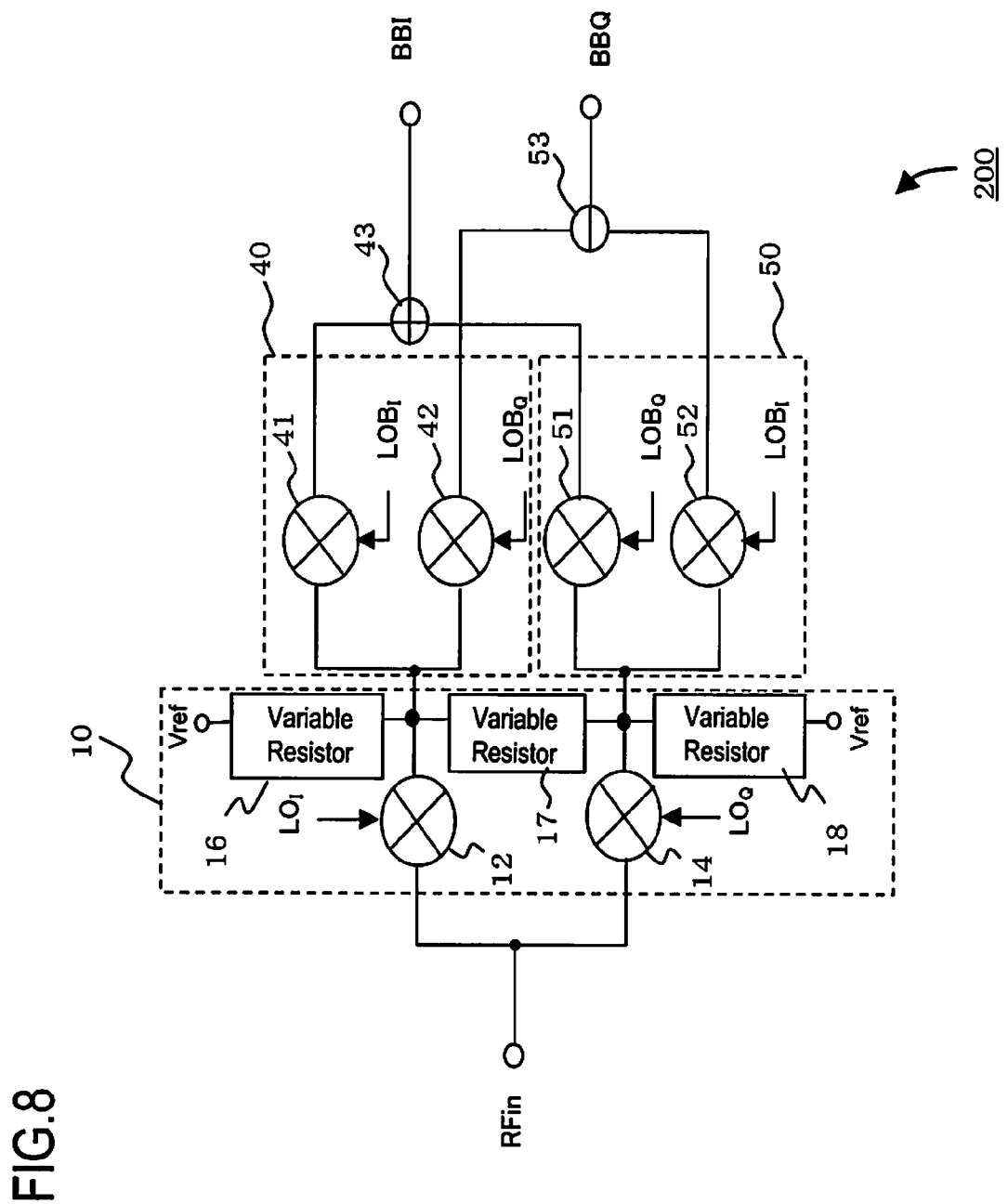
FIG. 8 depicts a constitutional example of an image elimination reception device.

FIG. 8 depicts a constitutional example of the image elimination type reception device 200. The image elimination type reception device 200 includes the orthogonal down mixer 10, two orthogonal demodulators 40, 50, an adder 43, and a subtractor 53.

Similarly to the first embodiment, the orthogonal error correction circuit 100 is applied to the orthogonal down mixer 10 and the orthogonal down mixer 10 includes the two mixer circuits 12, 14 and the three variable resistors 16 to 18. The connection relationships therebetween are similar to those of the orthogonal down mixer 10 according to the first embodiment.

The orthogonal demodulators 40, 50 respectively include mixer circuits 41 to 42 and 51 to 52. The mixer circuits 41, 42 are connected to the output of the mixer circuit 12 of the orthogonal down mixer 10, and respectively convert input signal into low frequency signals using local signals (LOBI, LOBQ), and output the converted signals.

The mixer circuits 51, 52 are connected to the output of the mixer circuit 14, and respectively convert input signals into low frequency signals using the local signals (LOBQ, LOBI), and output the converted signals.

The adder 43 adds the output signals of the two mixer circuits 41, 51 and outputs a signal (BBI).

The subtractor 53 subtracts the output signals of the two mixer circuits 42, 52 and outputs a signal (BBQ).

When the phase difference between the output signals of the orthogonal down mixer 10 deviates from 90°, the image elimination ratio deteriorates, as depicted in FIG. 6C. In the third embodiment, the image elimination ratio can be adjusted to an optimum value by adjusting the phase difference between the two output signals (intermediate frequency signals) of the orthogonal down mixer 10 to 90° (i.e. such that the phase error is eliminated) using the variable resistor 17. Further, similarly to the first embodiment, the phase error between the output signals of the orthogonal down mixer 10 is adjusted on the output side of the mixer circuits 12, 14 of the orthogonal down mixer 10, where the frequency is low, and therefore the error adjustment precision is improved in comparison with a case in which adjustment is performed on the input side of the mixer circuits 12, 14. Furthermore, only the variable resistors 16 to 18 are added, and therefore surface area and power consumption are reduced in comparison with the prior art.

Fourth Embodiment

Figure 9:
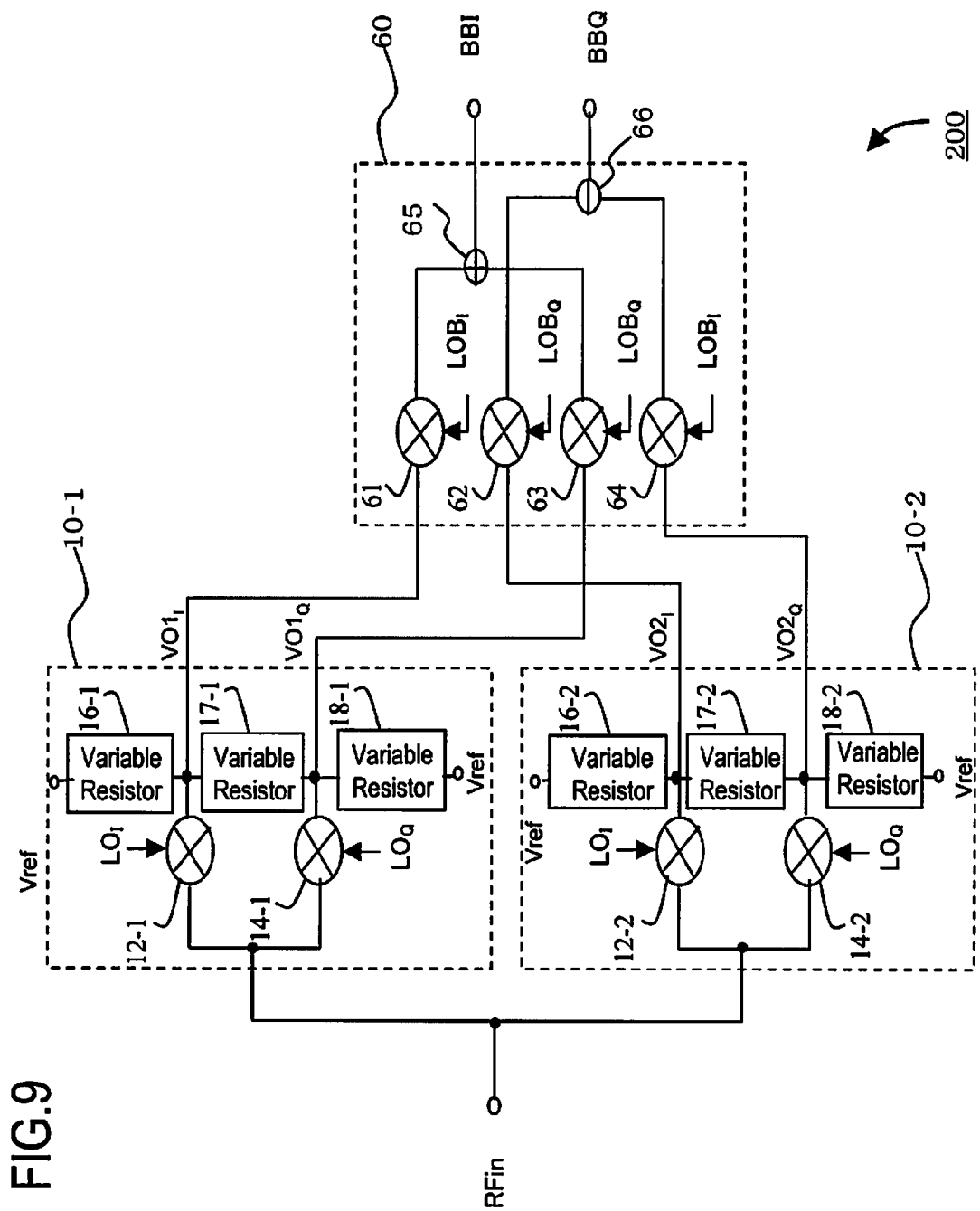
FIG. 9 depicts another constitutional example of an image elimination reception device.

Next, a fourth embodiment will be described. The fourth embodiment is another embodiment of the image elimination type reception device 200. FIG. 9 depicts a constitutional example of the image elimination type reception device 200.

The image elimination type reception device 200 includes the two orthogonal down mixers 10-1, 10-2 and an orthogonal demodulator 60.

Similarly to the first embodiment, each orthogonal down mixer 10-1, 10-2 has two mixer circuits 12-1, 14-1, 12-2, 14-2 and three variable resistors 16-1 to 18-1 and 16-2 to 18-2. The orthogonal down mixers 10-1, 10-2 are identical to the orthogonal down mixer 10 of the first embodiment.

The orthogonal demodulator 60 includes four mixer circuits 61 to 64, an adder 65, and a subtractor 66.

The mixer circuit 61 is connected to one output (VO1I) of the orthogonal down mixer 10-1, and converts an intermediate frequency signal (VOI) into a low frequency signal using a local signal (LOBI).

The mixer circuit 62 is connected to one output (VO2I) of the orthogonal down mixer 10-2, and converts an intermediate frequency signal (VO2I) into a low frequency signal using a local signal (LOBQ).

The mixer circuit 63 is connected to the other output (VO1Q) of the orthogonal down mixer 10-1, and converts an intermediate frequency signal (VO1Q) into a low frequency signal using the local signal (LOBQ).

The mixer circuit 64 is connected to the other output (VO2Q) of the orthogonal down mixer 10-2, and converts an intermediate frequency signal (VO2Q) into a low frequency signal using the local signal (LOBI).

The adder 65 adds the output signals of the two mixer circuits 61, 63 and outputs a signal (BBI).

The subtractor 66 subtracts the output signals of the two mixer circuits 62, 64 and outputs a signal (BBQ).

As depicted in FIG. 9, in the image elimination type reception device 200, the phase difference between the output signals (BBI) can be adjusted by the orthogonal down mixer 10-1, and the phase difference between the other output signals (BBQ) can be adjusted by the orthogonal down mixer 10-2. Hence, phase difference adjustment can be performed individually on the respective output signals (BBI, BBQ). Therefore, unnecessary frequency components can be removed, and furthermore, a phase error between the output signals (BBI, BBQ) caused by a phase error in the local signals (LOBI, LOBQ) of the orthogonal demodulator 60 can be adjusted.

Hence, in the orthogonal mixers 10, 20 having the orthogonal error correction circuit 100 according to the first to fourth embodiments described above, by connecting the variable resistor 17 between the orthogonal outputs of the two mixers 12, 14 and adjusting the variable resistance value, an orthogonal phase error can be adjusted. Moreover, by connecting the variable resistors 16 to 18 between the outputs of the respective mixers 12, 14 and the reference voltage (including the power supply and earth) and adjusting the variable resistance value, an orthogonal gain error can be adjusted.

Furthermore, by applying the orthogonal mixer 10 having the orthogonal error correction device 100 to the image elimination type receiver 200, an image suppression ratio can be corrected.

In the first to fourth embodiments, the orthogonal mixers 10, 20 and the image elimination type receiver 200 were described, but the present invention is not limited thereto and may be applied widely to circuits (orthogonal signal output circuits) for correcting an orthogonal error between output signals.

According to the present invention, an orthogonal signal output circuit which corrects an orthogonal error with a high degree of precision can be provided. Moreover, according to the present invention, an orthogonal signal output circuit in which both power consumption and circuit area are small can be provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An orthogonal signal output circuit having an error correction function for correcting an orthogonal error, comprising:

first and second differential circuits for mixing local signals with an RF signal; and first to fourth variable resistors, wherein the first variable resistor is connected to a positive output of the first differential circuit and a positive output of the second differential circuit;

the second variable resistor is connected to the positive output of the first differential circuit and a negative output of the second differential circuit;

the third variable resistor is connected to a negative output of the first differential circuit and the positive output of the second differential circuit; and the fourth variable resistor is connected to the negative output of the first differential circuit and the negative output of the second differential circuit.

2. The orthogonal signal output circuit according to claim 1, further comprising:

a fifth variable resistor disposed between the positive output of the first differential circuit and a reference voltage; and a sixth variable resistor disposed between the negative output of the first differential circuit and the reference voltage.

3. The orthogonal signal output circuit according to claim 2, further comprising:

a seventh variable resistor disposed between the positive output of the second differential circuit and the reference voltage; and an eighth variable resistor disposed between the negative output of the second differential circuit and the reference voltage.

4. The orthogonal signal output circuit according to claim 1, wherein the first and second differential circuits are respectively first and second mixer circuits in which a load is a resistance, and said local signals input respectively into the first and second mixer circuits are orthogonal or nearly orthogonal.

5. The orthogonal signal output circuit according to claim 4, further comprising third to sixth mixer circuits, wherein the third and fourth mixer circuits respectively receive an output of the first differential circuit as a main signal, and said local signals input respectively therein are orthogonal, the fifth and sixth mixer circuits respectively input an output of the second differential circuit as a main signal, and said local signals input respectively therein are orthogonal, respective outputs of the third and fifth mixer circuits are added or subtracted to obtain a first output, and respective outputs of the fourth and sixth mixer circuits are added or subtracted to obtain a second output.

6. The orthogonal signal output circuit according to claim 4, further comprising:

first and second orthogonal signal output circuits; and third to sixth mixer circuits, wherein the first and second orthogonal signal output circuits respectively comprise the first and second differential circuits, the first to fourth variable resistors, and the fifth to eighth variable resistors, the third mixer circuit receives an output of the first differential circuit of the first orthogonal signal output circuit as a main signal, the fourth mixer circuit receives an output of the first differential circuit of the second orthogonal signal output circuit as a main signal, the fifth mixer circuit receives an output of the second differential circuit of the first orthogonal signal output circuit as a main signal, the sixth mixer circuit receives an output of the second differential circuit of the second orthogonal signal output circuit as a main signal, said local signals input respectively into the third and fourth mixer circuits are orthogonal, and local signals input respectively into the fifth and sixth mixer circuits are orthogonal, respective outputs of the third and fifth mixer circuits are added or subtracted to obtain a first output, and respective outputs of the second and fourth mixer circuits are added or subtracted to obtain a second output.

7. The orthogonal signal output circuit according to claim 1, further comprising first and second mixer circuits, wherein the seventh mixer circuit receives an output of the first differential circuit as a main signal, the eighth mixer circuit receives an output of the second differential circuit as a main signal, said local signals input respectively into the first and second mixer circuits are orthogonal, and respective outputs of the first and second mixer circuits are added or subtracted and then output.

* * * * *